United States Patent [19]

Rosenberg et al.

[11] Patent Number: 5,377,301
[45] Date of Patent: Dec. 27, 1994

[54] TECHNIQUE FOR MODIFYING REFERENCE VECTOR QUANTIZED SPEECH FEATURE SIGNALS

[75] Inventors: Aaron E. Rosenberg, Berkeley Heights; Frank K.-P. Soong, Fanwood, both of N.J.

[73] Assignee: AT&T Corp., Murray Hill, N.J.

[21] Appl. No.: 184,768

[22] Filed: Jan. 21, 1994

Related U.S. Application Data

[63] Continuation of Ser. No. 8,269, Jan. 25, 1993, abandoned, which is a continuation of Ser. No. 900,801, Dec. 27, 1990, abandoned, which is a continuation of Ser. No. 462,847, Jan. 3, 1990, abandoned, which is a continuation of Ser. No. 845,501, Mar. 28, 1986, abandoned.

[51] Int. Cl.$^5$ ................................................ G10L 9/00
[52] U.S. Cl. .................................... 395/2.31; 395/2.55
[58] Field of Search ...................... 395/2.3, 2.31, 2.32, 395/2.52, 2.53, 2.54, 2.55; 381/34, 36, 41, 42, 43; 358/136; 382/14, 15

[56] References Cited

U.S. PATENT DOCUMENTS

| | | | |
|---|---|---|---|
| 3,624,302 | 11/1971 | Atal | 179/15 A |
| 4,181,821 | 1/1980 | Pirz et al. | 381/43 |
| 4,618,984 | 10/1986 | Das et al. | 381/43 |
| 4,670,851 | 6/1987 | Murakami et al. | 364/518 |
| 4,710,812 | 12/1987 | Murakami et al. | 358/136 |
| 4,751,737 | 6/1988 | Gerson et al. | 381/43 |
| 4,773,093 | 9/1988 | Higgins et al. | 381/42 |
| 4,783,804 | 11/1987 | Juang et al. | 381/43 |
| 4,802,224 | 1/1989 | Shiraki et al. | 381/34 |

OTHER PUBLICATIONS

Gray, "Vector Quantization", IEEE ASSP Magazine, vol. 1, No. 2, Apr. 1984, pp. 4–29.
Gersho et al., *"Vector Quantization: A Pattern-Matching Technique For Speech Coding"*, IEEE Comm. Magazine, Dec. 1983, pp. 15–21.
Juang et al., "Distortion Performance of Vector Quantization LPC Voice Coding", IEEE Trans. ASSP, vol. ASSP-30, No. 2, Apr. 1982, pp. 294–303.
Casey et al., "Advances in Pattern Recognition", Scientific American, Apr. 1971, pp. 56–71.
*Proceedings of the IEEE*, vol. 73, No. 11, Nov. 1985, "Vector Quantization in Speech Coding", pp. 1551–1588.
*ICASSP 83*, Boston, "An 800 BPS Adaptive Vector Quantization Vocoder Using A Perceptual Distance Measure", D. B. Paul, pp. 73–76.
Patent No. SHO 60[1985]–60696, issue in Japan on Sep. 13, 1983 to Y. Sato, N. Fujimoto.

*Primary Examiner*—Allen R. MacDonald
*Assistant Examiner*—Michael A. Sartori
*Attorney, Agent, or Firm*—Thomas A. Restaino; Kenneth M. Brown

[57] ABSTRACT

A signal processing arrangement uses a codebook of first vector quantized speech feature signals formed responsive to a large collection of speech feature signals. The codebook is altered by combining the first speech feature signals of the codebook with second speech feature signals generated responsive to later input speech patterns during normal speech processing. A speaker recognition template can be updated in this fashion to take account of change which may occur in the voice and speaking characteristics of a known speaker.

21 Claims, 4 Drawing Sheets

TECHNIQUE FOR MODIFYING REFERENCE VECTOR QUANTIZED SPEECH FEATURE SIGNALS

This application is a continuation of application Ser. No. 08/008,269, filed on Jan. 25, 1993, now abandoned, which is a continuation of application Ser. No. 07/900,801, filed on Dec. 27, 1990, now abandoned, which is a continuation of application Ser. No. 07/462,847 filed on Jan. 3, 1990, now abandoned, which was a continuation of application Ser. No. 06/845,501 filed on Mar. 28, 1986, now abandoned.

BACKGROUND OF THE INVENTION

The invention relates to speech analysis and more particularly to arrangements for generating signals representative of acoustic features of speech patterns of known speakers.

Digital speech coding is widely used to compress speech signals for efficient storage and transmission over communication channels and for use in automatic speech and voice recognition as well as speech synthesis. Coding arrangements generally involve partitioning a speech pattern into short time frame intervals and forming a set of speech parameter signals for each successive interval. One such digital speech coding system is disclosed in U.S. Pat. No. 3,624,302 issued to B. S. Atal, Nov. 30, 1971. The arrangement therein includes linear prediction analysis of speech signal in which the speech signal is partitioned into successive time frame intervals of 5 to 20 milliseconds duration, and a set of parameters representative of the speech portion of the time interval is generated. The parameter signal set includes linear prediction coefficient signals representative of the spectral envelope of the speech in the time interval, and pitch and voicing signals corresponding to the speech excitation. These parameter signals are encoded at a much lower bit rate than the speech waveform itself for efficient storage, transmission or comparison with previously stored templates to identify the speech pattern or the speaker. A replica of the original speech pattern may be formed from the parameter signal codes by synthesis in apparatus that generally comprises a model of the vocal tract in which the excitation pulses of each successive interval are modified by the interval spectral envelope prediction coefficients in an all-pole predictive filter. Spectral or other types of speech parameter signals may be utilized in speech coding using similar techniques.

Further compression of the speech pattern waveform may be achieved through vector quantization techniques well known in the art. In linear prediction analysis, the speech parameter signals for a particular time frame interval form a multidimensional vector and a large collection of such feature signal vectors can be used to generate a much smaller set of vector quantized feature signals that cover the range of the larger collection. One such arrangement is described in the article "Vector Quantization in Speech Coding" by John Makhoul et al appearing in the *Proceedings of the IEEE*, Vol. 73, No. 11, November 1985, pp. 1551-1588. Vector quantization is particularly useful in speaker recognition arrangements where feature signals obtained from a number of individuals must be stored so that they may be identified by an analysis of voice characteristics. A set of vector quantized feature signals may be generated from sets of I feature vectors $a(1), a(2), \ldots, a(I)$ obtained from many processed utterances. The feature vector space can be partitioned into subspaces $S_1, S_2, \ldots, S_M$. S, the whole feature space, is then represented as $$S = S_1 \cup S_2 \cup \ldots \cup S_M. \tag{1}$$

Each subspace $S_i$ forms a nonoverlapping region, and every feature vector inside $S_i$ is represented by a corresponding centroid feature vector $b(i)$ of $S_i$. The partitioning is performed so that the average distortion $$D = \frac{1}{I} \sum_{i=1}^{I} \min_{1 \leq m \leq M} d(a(i), b(m)) \tag{2}$$

is minimized over the whole set of original feature vectors. Using linear prediction coefficient (LPC) vectors as acoustic features, the likelihood ratio distortion between any two LPC vectors $a$ and $b$ may be expressed as $$d(a, b) = \frac{b^T R_a b}{a^T R_a a} - 1 \tag{3}$$

where $R_a$ is the autocorrelation matrix of the speech input associated with vector $a$. The distortion measure of equation 3 may be used to generate speaker-based VQ codebooks of different sizes. Such codebooks of quantized feature vectors may be used as reference features to which other feature vectors are compared for speech recognition, speech transmission, or speaker verification.

One problem encountered in the use of speech feature signals relates to the fact that speech patterns of individuals change over time. Such changes can result from temporary or permanent changes in vocal tract characteristics or from environmental effects. Consequently, stored speech feature signals that are used as references for speech processing equipment may differ significantly from feature signals later obtained from the same individuals even for the same speech messages. Where vector quantization is utilized, changes may be such that a codebook entry cannot be found within a reasonable distortion range of one or more input speech feature signals. In this event prior art arrangemnts have generally required that a new codebook be formed. But formation of a new codebook in the aforementioned manner requires complex and time consuming processing and may temporarily disable the speech processing equipment.

The article "An 800 BPS Adaptive Vector Quantization Vocoder Using a Perceptual Distance Measure" by Douglas B. Paul appearing in the *Proceedings of ICASSP 83*, pp. 73-76, discloses a technique for adapting a vector quantization codebook comprising spectral templates to changes in speech feature signals as a normal part of vocoder operation rather than generating a completely new codebook. The arrangement declares an incoming spectrum to be a new template if its distance from the nearest neighbor in the codebook template set exceeds a voicing decision dependent threshold. The least useful template as determined by the longest-time-since-use algorithm is replaced by the new template. The training and time-of-use recording devices are gated by a speech activity detector to prevent loading the codebook template set with templates representing background noise.

While the foregoing adaptive technique provides updating of a vector quantization codebook without disrupting operation of speech processing equipment, it does so by discarding codebook entries originally generated by careful analysis of a large collection of speech feature signals and inserting new codebook entries accepted on the basis of a single mismatch of an incoming speech signal to the codebook set. Thus, a valid and useful codebook entry may be replaced by an entry that is at the outer limit of expected feature signals. It is the object of the invention to provide an improved adaptation arrangement for vector quantized speech processing systems in which codebook entries are modified based on relative changes in speech features.

BRIEF SUMMARY OF THE INVENTION

The foregoing object is achieved by combining the originally generated vector quantization codebook vector signals with vector signals derived from speech patterns obtained during normal speech processing operation to form a modified vector quantization codebook. The invention is directed to an arrangement for modifying vector quantized speech feature signals in which a set of first vector quantized speech feature signals are stored to represent a collection of speech feature signals. The first speech feature signals are combined with second speech feature signals generated responsive to input speech patterns to modify the set of first vector quantized signals to be representative of both first and second speech feature signals.

According to one aspect of the invention, the formation of said first vector quantized speech feature signals includes generating a signal for each first speech feature signal representative of the number of occurrences of said feature signal in the collection of speech feature signals. The generation of the second speech feature signals includes formation of a signal representative of the number of occurances of the second speech feature signal. A modified speech feature signal is generated by combining the first and second speech feature signals responsive to the signals representative of the number of occurances of said first and second speech feature signals.

In an embodiment illustrative of the invention, a set of speech feature vector templates are stored for a known speaker to verify his or her identity. To account for changes in the voice characteristics of the speaker that may make the original templates less useful for verification, speech feature vectors obtained in the normal verification process are combined with the original generated templates to form an updated verification template set for the speaker. In particular, the original generation of templates includes forming a signal for each speech feature template representative of the number of occurrences of the speech feature signal known as the template occupancy. A signal is generated representative of the occupancy of the speech feature vectors obtained in the normal verification process. A modified speech feature signal is then formed from the weighted average of the occupancy signals of the original and verification speech features.

DETAILED DESCRIPTION

Figure 1:
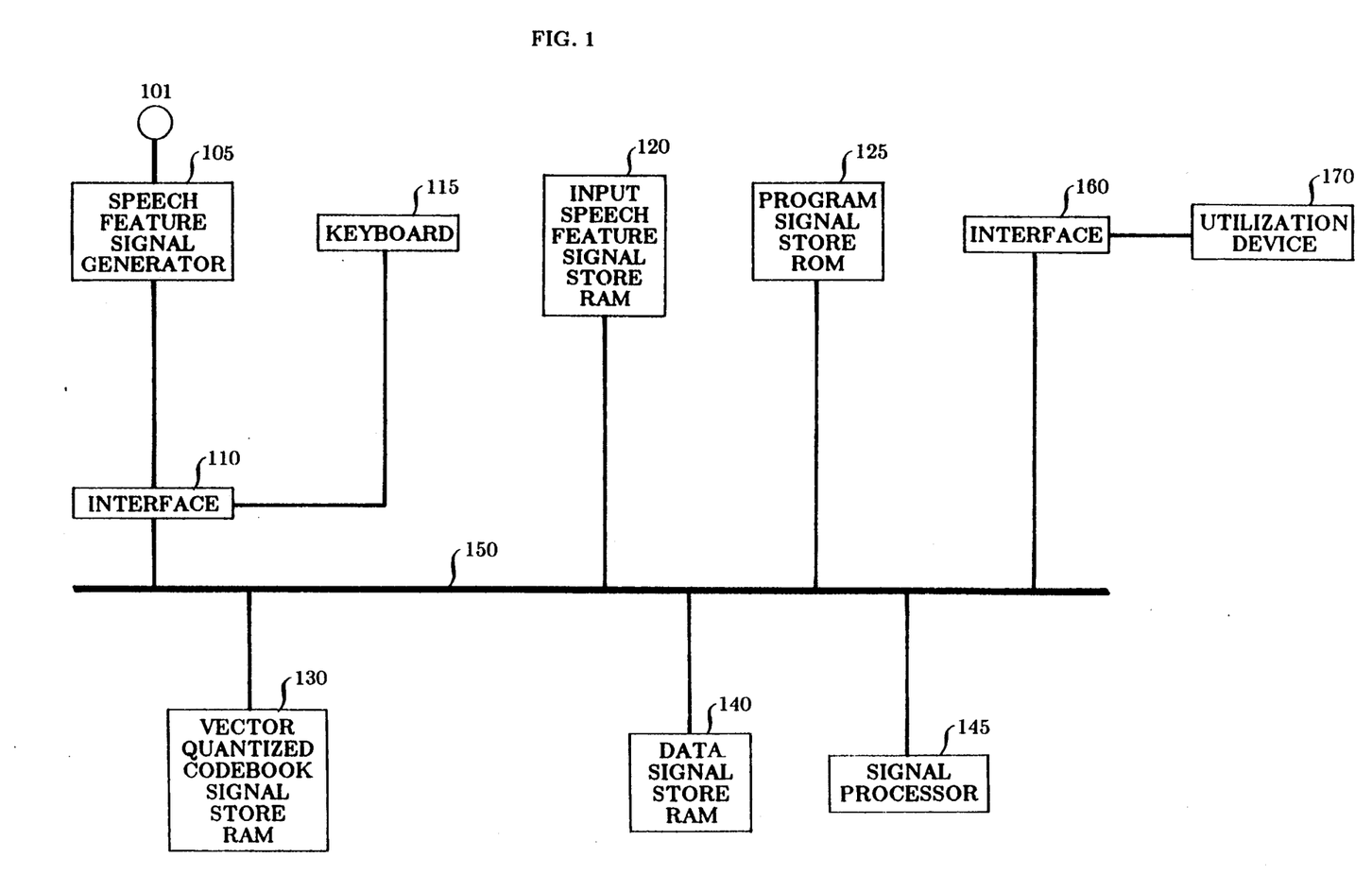
FIG. 1 depicts a block diagram of an arrangement for adaptively modifying speech feature signals illustrative of the invention.

FIG. 1 depicts a signal processing arrangement operative to adapt a set of vector quantized feature signals to changes in speech patterns that is illustrative of the invention. The arrangement of FIG. 1 may be part of a speaker recognition system in which a person asserts an identity and has his identity verified by an analysis of his speech characteristics. Such a speaker recognition arrangement is disclosed in copending application Ser. No. 715,524 issued Mar. 21, 1985 and assigned to the same assignee which application is incorporated by reference herein.

Referring to FIG. 1, input speech patterns from electroacoustic transducer 101 are converted into speech feature signals in speech feature generator 105. The feature generator is operative to partition incoming speech into successive time intervals, e.g., overlapping 45 millisecond frames. The feature signals from generator 105 are applied to signal processor 145 via interface 110 and bus 150. Signal processor 145 is operative to compare each successive incoming feature signal to the codebook feature signals previously stored in VQ codebook store 130. As a result of the comparison, a codebook entry signal may be selected for each input feature signal. Such an arrangement may be used in speech coders for many purposes.

In the aforementioned speaker recognition system, each person to be verified has a vector quantized codebook comprising speech feature signals characteristic of his speech. An identity is asserted through entries via keyboard 115 or other computer type input means and an identity code is stored in data signal memory 140. The person to be verified provides an utterance from which a sequence of speech feature signals are generated in generator 105. The closest codebook entry feature signal in VQ codebook store 130 is determined in signal processor 145 and a signal corresponding to the similarity between the incoming feature signal and the closest codebook entry is formed. Signal processor 145 may comprise the 68000 type microprocessors or other microprocessors well known in the art. The similarity signals for the sequence of input feature signals are accumulated and time normalized. The resulting cumulative signal is compared to a prescribed threshold. If the cumulative similarity signal is below the threshold, the identity is verified.

A problem arises, however, due to changes in the overall speech patterns of the individuals for which vector quantized codebooks have been formed and stored. In accordance with the invention, the codebook feature vector signals are adaptively modified to update the vector quantized codebook for the individual. After the input speech pattern is analyzed, the resulting feature signals are stored in input speech signal store 120. These feature signals are utilized to modify the feature signal entries in the vector quantized codebook for the identified person. If the input speech pattern is sufficiently long, the codebook is modified after the person's identity is verified. Alternatively, the input speech pattern feature signals may be stored after each verification until the number of feature signals reaches a predetermined minimum.

Figure 2:
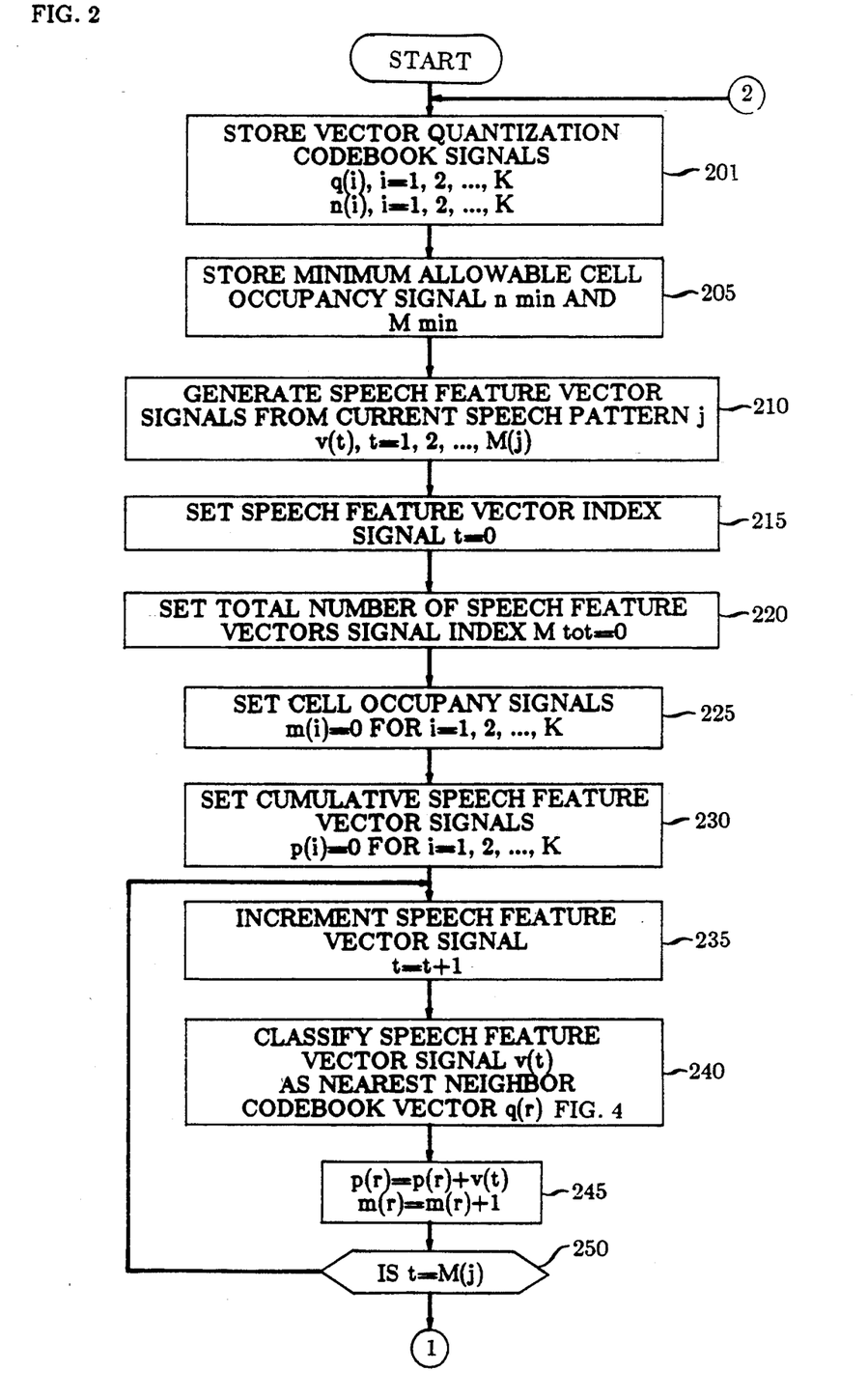
FIGS. 2, 3 and 4 show flow charts that illustrate the operation of the arrangement of FIG. 1.
Figure 3:
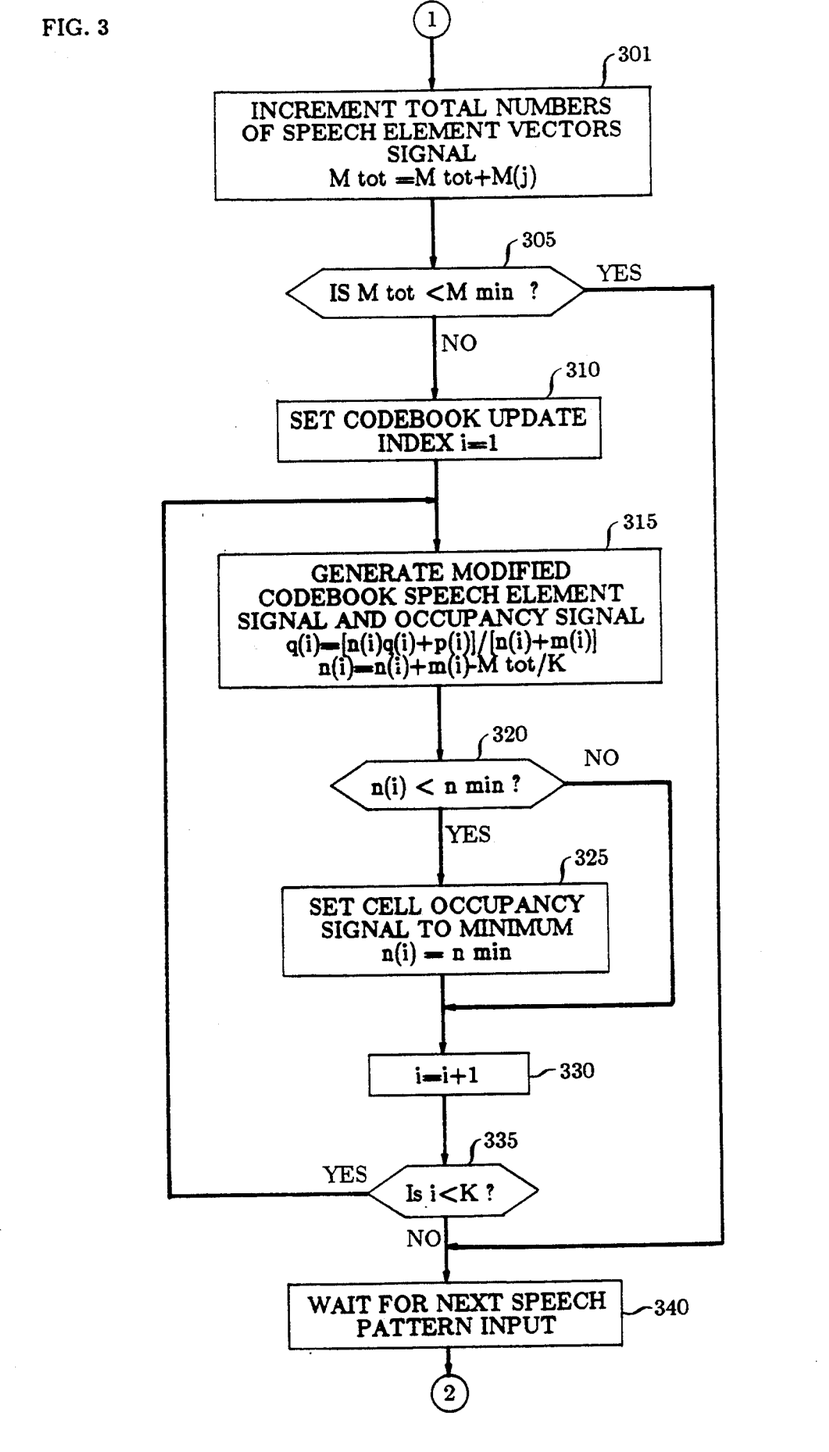
Figure 4:
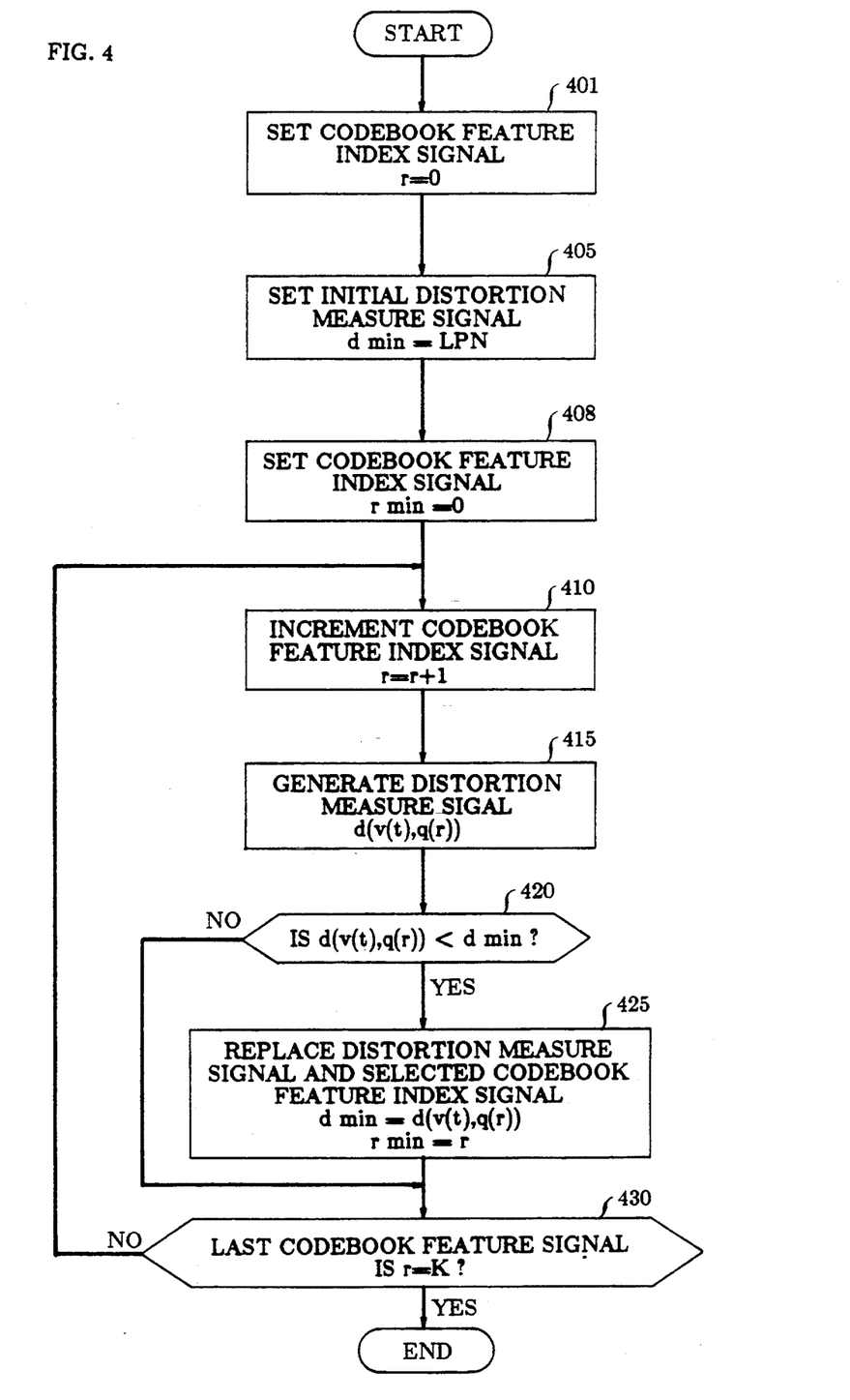

FIGS. 2, 3, and 4 are flow charts that illustrate the operation of the circuit of FIG. 1 in changing the codebook feature signals to improve the representation of the person's speech characteristics. A set of permanently stored instruction signals adapted to cause the arrangement of FIG. 1 to perform the steps of these flow charts is set forth in FORTRAN language form in Appendix A hereto. Referring to FIG. 2, vector quantized signals q(i) are stored in VQ codebook store 130 for use in later identification as described in the aforementioned patent application and indicated in step 201 of FIG. 2. In addition to storing the codebook feature signals q(i), signals n(i) corresponding to the number of occurrences of feature signals classified as codebook signal q(i) are also stored as per step 201. Each quantized vector signal q(i) can be thought of as representing a cell in the partitioned vector space of the codebook. The number of occurrences of feature signals classified as q(i) is denoted as the cell occupancy. In step 205, a minimum allowable occupancy signal $n_{min}$ is stored as well as a minimum update signal $M_{min}$. The $n_{min}$ signal is used if the occupancy of the cell is lower than a prescribed number and signal $M_{min}$ is used to determine if the number of speech features in the incoming speech pattern is sufficient to perform a valid update of the vector quantized codebook.

The sequence of input feature signals v(t) where t=1, 2, . . . , M(j) are generated from the jth speech pattern applied to transducer 101 as per step 210. In preparation for the vector quantized codebook modification, the speech feature vector index signal t is set to zero (step 215) and the count signal $M_{tot}$ corresponding to the total number of input feature vector signals is zeroed (step 220). The cell occupancy signals m(i) for the classified input feature vector signals are set to zero (step 225) and the cumulative classified input feature vector signals p(i) are zeroed (step 230) for i=1, 2, . . . , K. K is the number of codebook feature vectors.

The loop, including steps 235, 240, 245 and 250, is then entered and processor 145 of FIG. 1 is rendered operative to classify each successive input speech pattern signal v(t) as its nearest neighbor codebook feature vector signal q(r) (step 240). Upon classification in step 240, the cumulative feature vector signal p(r) for the classification r is augmented by the input feature vector signal v(r) and the cell occupancy for the classified vector m(r) is incremented (step 245). The processing of the input feature vectors is iterated through the successive feature signal inputs v(1), v(2) . . . , v(M(j)) until t=M(j) in step 250.

Classification step 240 is shown in greater detail in the flow chart of FIG. 4. The arrangement of FIG. 4 classifies each speech feature vector signal v(t) of the present speech pattern as the most similar vector quantized codebook feature vector q(i) by generating a signal $$d(v(t), q(i)) = \frac{q(i)^T R_{v(t)} q(i)}{v(t)^T R_{v(t)} v(t)} - 1 \qquad (4)$$

that corresponds to the distortion measure of equation 3. As a result of comparing the incoming vector v(t) to each codebook feature q(i) i=1, 2, . . . , K in accordance with equation 4, the feature vector q(r) closest to v(t) is selected.

In FIG. 4, initialization steps 401 and 405 are entered from step 235 of FIG. 2. The codebook feature vector index r is reset to zero as per step 401. A constant signal having a value of the largest possible number allowable in processor 145 is generated (step 405) and a corresponding index signal $r_{min}$ is produced (step 408). These signals are initially stored in data signal store 140 at locations reserved for the selected feature vector signal distortion measure and the selected feature index signal.

The loop including steps 410, 415, 420, 425 and 430 is then iterated through the codebook feature vector index signals r=1, 2, . . . , K.

Feature index r is incremented in step 410 and the distortion measure signal corresponding to equation 4 is formed for the q(r) feature signal in step 415. If the distortion measure signal is less than constant signal $d_{min}$, the value of $d_{min}$ is replaced by signal d(v(t),q(r)) and $r_{min}$ is replaced by index signal r as per step 415. Otherwise, the values of $d_{min}$ and $r_{min}$ remain unchanged. In either case, the next iteration is started in step 410 until the last codebook feature vector has been compared to speech pattern feature vector v(t).

When step 245 is entered from step 430, the nearest neighbor to vector v(t) in the codebook is identified by signal $r_{min}$ and is the index for signal p(r) in step 245. After all the input speech feature vectors v(t), t=1, 2, . . . , M(j) have been classified, step 301 of FIG. 3 is entered from decision step 250. In step 301, the total number of input feature vectors is augmented by the number of feature vectors in the jth speech pattern. If the total number of input feature vectors is less than the minimum required for vector codebook update ($M_{min}$), the input vector signals v(t) may be stored and the processor placed in state to wait for the next speech pattern input (step 340). Ordinarily, the identification utterances are sufficiently long so that the updating process of the loop including steps 310 through 335 is started. In the updating process, the input feature vector signals classified as a particular codebook vector are averaged with that codebook entry q(i) to form a modified codebook vector. In accordance with the invention, codebook performance is improved by collecting speech patterns over a long period of time to account for natural variations in speaker behavior.

In particular, the speaker reference prototype vector signals are updated by a weighted average with the current speech pattern feature vector signals. The modified vector q'(i) is formed by weighting according to $$q'(i) = [n(i)q(i) + p(i)]/[n(i) + m(i)] \qquad (5)$$

The feature vector cell occupancy is also modified according to:

$$n'(i) = \max(n(i) + m(i) - M_{tot}/K, n_{min}) \qquad (6)$$

p(i) is the accumulation of the speech pattern vector signals classified as codebook feature vector q(i) and n(i)q(i) represents the cumulative codebook vector signal. Equation 5 then represents the weighted average of the p(i) and n(i) q(i) so that the codebook feature vector is modified in accordance with changes in the identified feature over time. The modified cell occupancy of equation 6 may result in a negative value. In such an event, a default value of $n_{min}$ is selected. Alternatively, the modified vector signal q'(i) and the modified cell occupancy signal may be formed as $$q'(i) = \lambda q(i) + (1-\lambda)p(i)/m(i)$$

$$n'(i) = \lambda n(i) + (1-\lambda)m(i) \qquad (7)$$

where λ may be a fixed value between 0 and 0 such as 0.95 or $$\lambda = n(i)/(n(i) + m(i)) \qquad (8)$$

FIG. 3, the codebook update index is reset to one (step 310) so that the first codebook feature signal q(i) and the cumulative input feature signal p(i) classified as that codebook entry are accessed. The modified codebook feature vector signal q(i) is generated in accordance with equation 5 and the occupancy value n(i) is updated according to equation 6 in step 315. If the new occupancy value n(i) is less than $n_{min}$, n(i) is set to $n_{min}$ in step 325. The feature vector index i is incremented in step 330 and step 315 is reentered via decision step 335 until the last codebook feature vector has been modified (step 335). The signal processor is then placed in a wait state until the next speech pattern is applied to transducer 101.

The invention has been described with reference to illustrative embodiments thereof. It is apparent, however, to one skilled in the art that various modifications and changes may be made without departing from the spirit and scope of the invention.

APPENDDIX A

```
        real q(K),p(K)v(M)
        integer n(K),m(K)
        integer t,r
        data nmin,Mmin,/4,100/
        call getbk(q,n,K)!fetch codebook vectors and occupancies
        call getspeech(v,Mj)!fetch speech vectors
        Mtot=0!init total no. of test vectors
c init accum. test cell vectors and occupancies
        do 10 i=1,K
        m(i)=0
        p(i)=0.
10      continue
c encode test vectors and obtain accum. test cell vectors and occupancies
        do 20 t=1,Mj
        call encode(q,K,v(t),r,dmin)
c r is the index of the best matching codebook vector and
c dmin is the resulting distortion (used for the verification decision)
        p(r)=p(r)+v(t)!accum. the r-th test cell
        m(r)=m(r)+1!increment the r-th test cell occupancy
20      continue
        Mtot=Mtot+Mj
        if(Mtot.lt.Mmin)call GTSPCH ; get more test speech
c adapt codebook vectors and occupancies
        do 30 i=1,K
        q(i)=(n(i)*g(i)+p(i))/(n(i)+m(i))!adapt i-th codebook vector
        n(i)=max0(nmin,n(i)+m(i)-Mtot/K)!adapt i-th codebook occupancy
30      continue
        stop
        end
        subroutine encode(q,K,v,r,dmin)
        real q(K)
        data dmin/big/
        do 10 i=1,k
        dst=d(v,q(i))!d is a distance function routine
        if(dst.lt.dmin)then
            dmin=dst
            r=i
            end if
        continue
        return
        end
```

What is claimed is:

1. An arrangement for modifying a codebook of vector quantized speech feature signals for speaker verification or adaptation to the voice of a particular speaker comprising:

means for storing a set of vector quantized feature signals q(i), i=1, 2, ..., K, where K is the number of vector quantized feature signals in said set, and a set of occupancy signals n(i) each corresponding to one of said vector quantized feature signal q(i);

means for receiving an input pattern;

means for analyzing said input pattern to generate a set of input feature vector signals v(t), t=1,2, ..., M, where M is the number of vector-quantized feature signals in an input pattern;

means responsive to said set of input feature signals and said set of vector quantized feature signals for classifying each input feature signal v(t) as one of said set if vector quantized feature signals q(i);

means responsive to the classification of each input feature signal as one of said vector quantized feature signals for generating an occupancy signal m(i) corresponding to the count of input feature signals classified as each one of said vector quantized feature signals q(i); and means for modifying said set if vector quantized feature vector signals, q(i), to produce a modified set of vector quantized feature vector signals, q'(i), based on said classified input feature vector signals, said input feature occupancy signals, said vector quantized feature signals, and said occupancy signals of said vector quantized feature signals 2. An arrangement for modifying a codebook of vector quantized feature signals according to claim 1 wherein said input pattern comprises an unidentified input pattern.

3. An arrangement for modifying a codebook of vector quantized feature signals according to claim 2 wherein said vector quantized feature signal modifying means comprises:

means responsive to each of said vector quantized feature signal q(i) and to each corresponding one of said vector quantized feature occupancy signals n(i) for forming a weighted vector quantized feature signal;

means responsive to each of said input feature signals v(t) classified as one of vector quantized feature signals q(i) and a corresponding one of occupancy signals m(i) for forming a weighted input feature vector signal; and means responsive to said weighted vector quantized feature signal; and said weighted input feature vector signal for generating one of said modified set of vector quantized feature signals q'(i).

4. An arrangement for modifying a codebook of vector quantized feature vector signals according to claim 2, wherein said modifying means comprises means for forming a signal corresponding to $$q'(i) = [n(i)q(i) + p(i)]/[n(i) + m(i)],$$

for each value of i, where each n(i)q(i) is a weighted codebook vector quantized feature signal, each n(i) is occupancy signal for each said codebook vector quantized signal q(i), each p(i) is a weighted input feature signal classified as the corresponding one of the vector quantized feature signals q(i), and each m(i) is the occupancy signal for said input feature signal.

5. An arrangement for modifying a codebook of vector quantized feature vector signals according to claim 4 further comprising:

means responsive to said vector quantized feature occupancy signal and said input feature signal occupancy signal for modifying said vector quantized feature occupancy signal.

6. An arrangement for modifying a codebook of vector quantized feature vector signals according to claim 5 wherein said vector quantized feature occupancy signal modifying means comprises:

means for forming signals corresponding to $$n'(i) = n(i) + m(i) - M_{tot}/K$$

where each n'(i) is the modified vector quantized feature occupancy signal, each n(i) is the feature occupancy signal of the codebook ith feature vector signal, each m(i) is the occupancy signal for a corresponding one of the input feature vector signals classified as the ith codebook feature vector signal, $M_{tot}$ is the total number of input feature vector signals, and K is the total number of the codebook quantized feature vector signals.

7. An arrangement for modifying a codebook of vector quantized feature vector signals according to claim 2 wherein said modifying means comprises forming a signal corresponding to $$q'(i) = (\lambda)q(i) + (1-\lambda)p(i)/m(i)$$

for each value of i, where each p(i) is the weighted input feature signal classified as the corresponding one of the vector quantized feature signals q(i) and each m(i) is the occupancy signal for said input feature signal, m(i) < < n(i), and λ is a relative weighting factor which attributes substantially greater significance to n(i) than to m(i).

8. An arrangement for modifying a codebook of quantized feature vector signals according to claim 7 further comprising:

means for modifying said vector quantized feature occupancy signals responsive to said vector quantized feature occupancy signals and said input feature signal occupancy signals.

9. An arrangement for modifying a codebook of vector quantized feature signals according to claim 8 wherein said vector quantized feature occupancy signal modifying means comprises:

means for forming signals corresponding to $$n'(i) = \lambda n(i) + (1-\lambda)m(i)$$

for each value of is.

10. An arrangement for modifying a codebook of vector quantized feature signals according to claim 1, 3, 4, 5, 6, 7, 8 or 2 wherein each feature signal is a speech feature signal and each input pattern is a speech signal.

11. In a signal processing arrangement having a stored codebook of a set of vector quantized speech feature signals q(i) i=1, 2, ..., K, where K is the number of vector quantized feature signals in said set, and occupancy signals n(i) each corresponding to one of said vector quantized feature signals, a method for modifying the codebook of vector quantized feature signals for speaker verification or adaptation to the voice of a particular speaker comprising the steps of:

receiving an input pattern;

analyzing said input pattern to generate a set of input feature vector signals v(t), t=1, 2, ..., M, where M is the number of vector-quantized feature signals in an input pattern;

classifying each input feature vector signal v(t) as one of said set of vector quantized feature signals q(i) responsive to said input feature signals and said set of vector quantized feature signals;

generating an occupancy signal m(i) corresponding to the count input feature vector signals classified as respective ones of said vector quantized feature signals q(i) responsive to the classifying step; and modifying said set of vector quantized feature vector signals, q(i), based on said classified input feature vector signals, said input feature occupancy signals, said vector quantized feature signals and said occupancy signals of said vector quantized feature signals.

12. In a signal processing arrangement having a stored codebook of vector quantized feature signals q(i) i=1, 2, ..., K and a set of occupancy signals n(i) each corresponding to one of said vector quantized feature signals, a method for modifying the codebook of vector quantized feature signals according to claim 11 wherein said input pattern comprises an unidentified input pattern.

13. In a processing arrangement having a stored codebook of vector quantized feature signals q(i)i=1, 2, ..., K and a set of occupancy signals n(i) each corresponding to one of said vector quantized feature signals, a method for modifying the codebook of vector quantized feature signals according to claim 12 wherein said vector quantized feature signal modifying step comprises:

forming a weighted vector quantized feature signal responsive to each of said vector quantized feature signals q(i) and each of said vector quantized feature occupancy signals n(i);

forming a weighted input feature signal responsive to each of said input feature signals n(t) classified as vector quantized feature signals q(i); and generating a set of modified vector quantized signals q'(i) responsive to said weighted vector quantized feature signal and said weighted input feature signal for each of said vector quantized feature signals q(i).

14. In a signal processing arrangement having a stored codebook of a set of vector quantized feature signals q(i) i=1, 2, ..., K and a set of occupancy signals n(i) each corresponding to one of said vector quantized feature signals, a method for modifying the codebook of vector quantized feature signals according to claim 12 wherein said generating step comprises means for forming a signal corresponding to $$q'(i)=[n(i)q(i)+p(i)]/[n(i)+m(i)],$$

for each value of i, where n(i)q(i) is the set of weighted codebook vector quantized feature signals, p(i) is the set of weighted input feature signals each classified as one of the vector quantized feature signals q(i), and each m(i) is the occupancy signal for said input feature signal.

15. In a signal processing arrangement having a stored codebook of a set of vector quantized feature signals q(i) i=1, 2, ..., K and a set of occupancy signals n(i) each corresponding to one of said vector quantized feature signals, a method for modifying the codebook of vector quantized feature signals according to claim 14 further comprising the step of:

modifying each of said vector quantized feature occupancy signals responsive to each of said vector quantized feature occupancy signals and each of said input feature signal occupancy signals.

16. In a signal processing arrangement having a stored codebook of a set of vector quantized feature signals q(i) i=1, 2, ..., K and a set of occupancy signals n(i) each corresponding to one of said vector quantized feature signals, a method for modifying the codebook of vector quantized feature signals according to claim 15 wherein said vector quantized feature occupancy signal modifying step comprises:

forming a set of signals corresponding to $$n'(i)=n(i)+m(i)-M_{tot}/K$$

where n'(i) is the the set of modified vector quantized feature occupancy signals, n(i) is the feature occupancy signals of the codebook ith feature vector signals, m(i) is the set of occupancy signals for input pattern signals classified as respective ith codebook feature, $M_{tot}$ is the total number of input feature signals, and K is the total number of the codebook quantized feature signals.

17. In a signal processing arrangement having a stored codebook of a set of vector quantized feature signals q(i) i=1, 2, ..., K and a set of occupancy signals n(i) corresponding each to one of said vector quantized feature signals, a method for modifying the codebook of vector quantized feature signals according to claim 12 wherein said generating comprises forming a signal corresponding to $$q'(i)=(\lambda)q(i)+(1-\lambda)p(i)/m(i)$$

for each value of i, where each p(i) is the weighted input feature signal classified as one of the vector quantized feature signals q(i), each m(i) is the occupancy signal for said input feature signal, m(i)<<n(i), and λ a relative weighting factor which attributes substantially greater significance to n(i) than to m(i).

18. In a signal processing arrangement having a stored codebook of a set of vector quantized feature signals q(i) i=1, 2, ..., K and a set of occupancy signals n(i) each corresponding to one of said vector quantized feature signals, a method for modifying the codebook of vector quantized feature signals according to claim 17 further comprising the step of:

modifying each said vector quantized feature occupancy signal responsive to each said vector quantized feature occupancy signal and each said input feature signal occupancy signal.

19. In a signal processing arrangement having a stored codebook of a set of vector quantized feature signals q(i) i=1, 2, ..., K and a set of occupancy signals n(i) each corresponding to one of said vector quantized feature signals, a method for modifying the codebook of vector quantized feature signals according to claim 18 wherein said vector quantized feature occupancy signal modifying step comprises:

forming a set of signals corresponding to $$n'(i)=\lambda n(i)+(1-\lambda)m(i)$$

where n'(i) is the set of modified vector quantized feature occupancy signals, n(i) is the set of feature occupancy signals of the codebook ith feature signals, m(i) is the set of occupancy signals for input feature signals classified as the ith codebook feature signals, and λ is n(i)/(n(i)+m(i)), for each value of i.

20. An arrangement for modifying a codebook of vector quantized feature signals according to claims 11, 13, 14, 15, 16, 17, 18, 19 or 12 wherein each feature signal is a speech feature signal and each input pattern is a speech signal.

21. In a signal processing arrangement having a stored codebook of a set of vector quantized feature signals q(i) i=1, 2, ... K, where K is the number of vector quantized feature signals in said set, and occupancy signals n(i) each corresponding to one of said vector quantized feature signals, a method for modifying the codebook of vector quantized feature signals, the method comprising the steps of:

receiving an input pattern;

analyzing said input pattern to generate a set of input feature vector signals v(t), t=1, 2, ..., M, where M is the number of vector-quantized feature signals in an input pattern;

classifying each input feature vector signal v(t) as one of said set of vector quantized feature signals q(i) responsive to said input feature signals and said set of vector quantized feature signals;

generating an occupancy signal m(i) corresponding to the count input feature vector signals classified as respective ones of said vector quantized feature signals q(i) responsive to the classifying step; and modifying said set of vector quantized feature vector signals, q(i), based on said classified input feature vector signals, said input feature occupancy signals, said vector quantized feature signals and said occupancy signals of said vector quantized feature signals.

* * * * *